(12) United States Patent
Tsukamoto

(10) Patent No.: US 10,431,438 B2
(45) Date of Patent: Oct. 1, 2019

(54) TITANIUM TARGET FOR SPUTTERING AND MANUFACTURING METHOD THEREOF

(71) Applicant: JX Nippon Mining & Metals Corporation, Tokyo (JP)

(72) Inventor: Shiro Tsukamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/771,519

(22) PCT Filed: Mar. 3, 2014

(86) PCT No.: PCT/JP2014/055226
§ 371 (c)(1),
(2) Date: Aug. 31, 2015

(87) PCT Pub. No.: WO2014/136702
PCT Pub. Date: Sep. 12, 2014

(65) Prior Publication Data
US 2016/0005576 A1 Jan. 7, 2016

(30) Foreign Application Priority Data

Mar. 6, 2013 (JP) ................................ 2013-043904

(51) Int. Cl.
| | |
|---|---|
| C23C 14/34 | (2006.01) |
| H01J 37/34 | (2006.01) |
| C22C 14/00 | (2006.01) |
| C22F 1/00 | (2006.01) |
| C22F 1/18 | (2006.01) |

(52) U.S. Cl.
CPC .......... *H01J 37/3426* (2013.01); *C22C 14/00* (2013.01); *C22F 1/00* (2013.01); *C22F 1/18* (2013.01); *C22F 1/183* (2013.01); *C23C 14/3414* (2013.01)

(58) Field of Classification Search
CPC .................................................. H01J 37/3426
See application file for complete search history.

(56) References Cited

U.S. PATENT DOCUMENTS

| | | | |
|---|---|---|---|
| 5,772,860 A * | 6/1998 | Sawada ............... | C23C 14/3414 204/192.12 |
| 5,798,005 A | 8/1998 | Murata et al. | |

(Continued)

FOREIGN PATENT DOCUMENTS

| | | |
|---|---|---|
| JP | H07-090560 A | 4/1995 |
| JP | H07-090561 A | 4/1995 |

(Continued)

*Primary Examiner* — Jason Berman
(74) *Attorney, Agent, or Firm* — Howson & Howson LLP

(57) ABSTRACT

A high-purity titanium target for sputtering having a purity of 5N5 (99.9995%) or higher, wherein the high-purity titanium target has no macro pattern on the target surface. An object of this invention is to provide a high-quality titanium target for sputtering, in which impurities causing particles and abnormal discharge phenomena are reduced, and which is free from fractures and cracks even during high-rate sputtering, and capable of stabilizing the sputtering characteristics, effectively inhibiting the generation of particles during deposition, and improving the uniformity of deposition.

10 Claims, 1 Drawing Sheet

Enlarged View of A Part

Enlarged View of B Part

(56) References Cited

U.S. PATENT DOCUMENTS

| | | |
|---|---|---|
| 5,993,621 A | 11/1999 | Liu |
| 6,210,502 B1 | 4/2001 | Takahashi |
| 6,284,111 B1 | 9/2001 | Takahashi et al. |
| 6,302,977 B1 | 10/2001 | Liu |
| 6,416,595 B2 | 7/2002 | Yao et al. |
| 6,423,161 B1 | 7/2002 | Yao et al. |
| 6,428,638 B2 | 8/2002 | Yao et al. |
| 6,509,102 B1 | 1/2003 | Liu |
| 6,746,553 B2 | 6/2004 | Yao et al. |
| 6,755,948 B1 | 6/2004 | Fukuyo et al. |
| 6,833,058 B1 | 12/2004 | Turner et al. |
| 8,663,440 B2 | 3/2014 | Tsukamoto et al. |
| 9,068,258 B2 | 6/2015 | Tsukamoto et al. |
| 2001/0015242 A1* | 8/2001 | Yao .................. C22F 1/04 148/421 |
| 2003/0132108 A1 | 7/2003 | Takahashi et al. |
| 2005/0121320 A1* | 6/2005 | Okabe .................. C22C 9/00 204/298.13 |
| 2014/0027277 A1 | 1/2014 | Makino et al. |
| 2014/0251802 A1 | 9/2014 | Tsukamoto et al. |
| 2015/0021174 A1 | 1/2015 | Yagi et al. |

FOREIGN PATENT DOCUMENTS

| | | |
|---|---|---|
| JP | H07-090562 A | 4/1995 |
| JP | H07-278804 A | 10/1995 |
| JP | H08-232061 A | 9/1996 |
| JP | H08-333676 A | 12/1996 |
| JP | H09-143704 A | 6/1997 |
| JP | H11-050244 A | 2/1999 |
| JP | H11-269640 A | 10/1999 |
| JP | 2000-045067 A | 2/2000 |
| JP | 2001-115257 A | 4/2001 |
| JP | 2003-253411 A | 9/2003 |

* cited by examiner

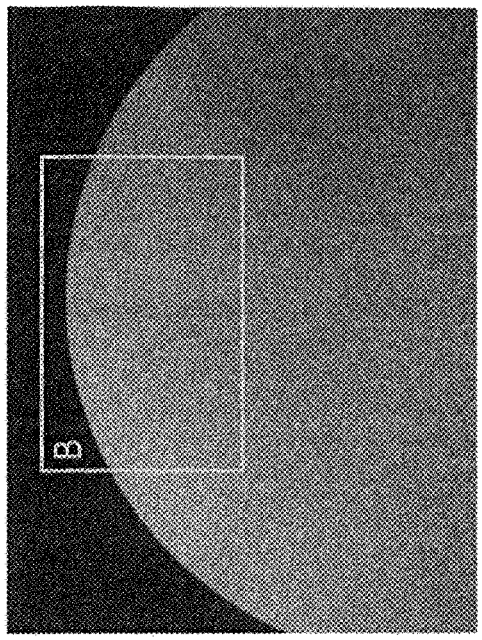
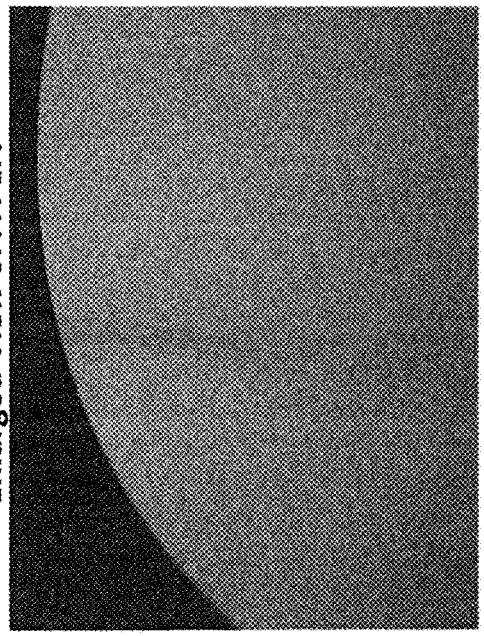
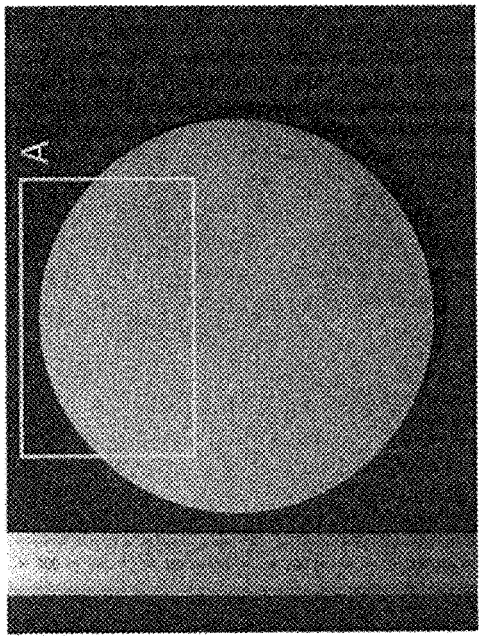

TITANIUM TARGET FOR SPUTTERING AND MANUFACTURING METHOD THEREOF

BACKGROUND

The present invention relates to a high-quality titanium target for sputtering which is capable of reducing the impurities contained therein, free from the generation of fractures and cracks during high-rate sputtering, capable of stabilizing the sputtering characteristics, and capable of effectively inhibiting the generation of particles during deposition.

The impurity concentration described in the present specification will be displayed in mass percent (mass %) in all cases.

In recent years, various electronic devices have been devised beginning with the exponential advancement of semiconductors, and the improvement of the performance thereof as well as the development of new devices are being sought on a daily basis.

Under these circumstances, there is an inclination toward the miniaturization of electronic devices and equipment and increase in the degree of integration thereof. Various thin films are formed during the manufacturing process of many of such devices and equipment, and titanium, from its unique metallic property, is also used in the formation of thin films of various electronic devices as titanium or titanium alloy films, titanium silicide films, titanium nitride films, or the like.

What is noteworthy upon forming this kind of titanium (including alloy/compound) thin film is that the film itself is demanded of extremely high purity.

The thin films used in semiconductor devices and the like are prone to become even thinner and shorter, and because the distance between the thin films is extremely small and the integration density is increasing, there is a problem in that the substances configuring the thin films or the impurities contained in such thin films become diffused to the adjacent thin films. Consequently, the balance of the constituent substances of the subject film and the adjacent films is disrupted, and there is a major problem in that the functions of the film, which are inherently required, will deteriorate.

During the production process of this kind of thin film, there are cases where the thin film is heated to several hundred degrees, and the temperature also rises during the use of the electronic devices with a semiconductor device built therein. This kind of temperature rise additionally increases the diffusion rate of the foregoing substances, and causes the major problem of deteriorating the functions of the electronic devices due to such diffusion. Moreover, generally speaking, the aforementioned titanium and titanium alloy films, titanium silicide films or titanium nitride films can be formed with a physical deposition method such as sputtering or vacuum deposition. Explained below is the sputtering method which is used most comprehensively among the above.

This sputtering method is a method of physically colliding positive ions such as $Ar^+$ to a target disposed on a cathode and discharging the metal atoms structuring the target with the collision energy thereof. Nitrides can be formed by using titanium or its alloy (TiAl alloy, etc.) as the target and conducting sputtering under a mixed gas atmosphere of argon gas and nitrogen.

When impurities exist in the titanium (including alloy/compound) target upon forming the sputtered film, there are problems in that: the coarsened grains floating within the sputtering chamber become adhered to the substrate and cause disconnection or short circuit in the thin-film circuit; the amount of generated particles, which cause the protrusions of the thin film, will increase; and a uniform film cannot be formed.

In light of the foregoing circumstances, it goes without saying that it was conventionally necessary to reduce transition metals, high melting point metals, alkali metals, alkali rare earth metals or other metals that become impurities, but the current situation is that, even if the foregoing elements are reduced as much as possible, the foregoing particles are still generated, and a fundamental solution has not yet been discovered.

Moreover, while a titanium thin film is sometimes used as a pasting layer for preventing the generation of particles upon forming a titanium nitride Ti—N film, the film is too hard to obtain sufficient strength of adhesive bonding, and there is a problem in that the film becomes separated from the interior wall of the deposition device or components and is unable to function as a pasting layer so that it causes the generation of particles.

In order to improve the production efficiency, there are demands for high-rate sputtering (high-power sputtering). Here, there are cases where the target is subject to fractures or cracks, and these problems tend to prevent stable sputtering. Patent Document 1 and Patent Document 2 listed below are cited as prior art documents.

Generally speaking, in order to improve the sputtering characteristics (uniformity of film thickness, particles), a fine and uniform structure is desirable. With a product having a purity 4N5 (99.995%) or a product having a purity of 5N (99.999%) which is generally used as a titanium sputtering target, an ingot is subject to hot forging, and thereafter cut and subject to rolling and heat treatment in order to obtain a uniform crystal structure having an average crystal grain size of 10 microns or less.

In recent years, materials with higher purity are demanded in cutting-edge processes, and titanium materials are also demanded to have a purity level of 5N5. However, when a high-purity Ti ingot having a purity of 5N5 (99.9995) or higher is used to prepare a target based on the conventional processes and conditions, there is a problem in that a macro pattern irregularity is formed on the target surface, and the average crystal grain size becomes larger than 10 microns. Moreover, upon comparing the average crystal grain size of locations where a macro pattern irregularity is formed and the average crystal grain size of locations where a macro pattern irregularity is not formed, there was a difference of 20% or more.

Consequently, when this target is sputtered, both the uniformity and particles were inferior in comparison to conventional products.

The Prior Art Documents include Patent Documents 3 to 6 related to titanium targets which were previously developed by the Applicant, and other related Patent Documents 7 to 12.

Nevertheless, these Patent Documents mainly relate to the crystal grain size of the titanium target, crystal orientation, and method of bonding the target and the backing plate, and while certain Patent Documents prescribe the purity, the prescribed purity is merely a purity level of 4N5 (99.995%).

None of these Patent Documents investigate the cause of the problems arising when producing a target from titanium having a purity level of 5N5, particularly the deterioration in uniformity and the macro pattern irregularity formed on the target surface that causes the generation of particles, and the problems regarding uniformity and particles still remained.

Patent Document 1: International Publication No. WO 01/038598
Patent Document 2: JP 2001-509548 A
Patent Document 3: JP H07-090560 A
Patent Document 4: JP H07-090561 A
Patent Document 5: JP H07-090562 A
Patent Document 6: JP 2000-204467 A
Patent Document 7: JP H07-278804 A
Patent Document 8: JP H08-333676 A
Patent Document 9: JP H11-050244 A
Patent Document 10: JP 2001-115257 A
Patent Document 11: JP H08-269701 A
Patent Document 12: JP H09-143704 A

SUMMARY

An object of the present invention is to resolve the various problems described above; in particular to provide a sputtering target, in which impurities causing particles and abnormal discharge phenomena are reduced, which is free from fractures and cracks even during high power sputtering (high-rate sputtering), capable of stabilizing the sputtering characteristics, and free from macro pattern irregularities, and of which average crystal grain size is 10 microns or less; and to further provide a high-quality titanium target for sputtering, which is capable of improving the uniformity during deposition and effectively inhibiting the generation of particles.

The present invention provides the following invention.
1) A high-purity titanium target for sputtering having a purity of 5N5 (99.9995%) or higher, wherein the high-purity titanium target has no macro pattern on the target surface.

Note that, while a macro pattern is a pattern that is unique to the high-purity titanium target for sputtering of the present invention, when comparing the locations where a macro pattern is observed and the locations where a macro pattern is not observed through the target surface observation, it was discovered that, "with the locations where a macro pattern is observed, the average crystal grain size differs by 20% or more, and the crystal orientation ratio differs by 10% or more". Consequently, it can understood that, with the locations where a macro pattern does not exist, the difference in the average crystal grain size is less than 20% and the difference in the crystal orientation ratio is less than 10%.

Accordingly, the locations (parts) on the surface of the high-purity titanium target for sputtering of the present invention in which "the difference in the average crystal grain size is 20% or more and the difference in the crystal orientation ratio is 10% or more" can be defined as the locations (parts) where a macro pattern exists. The term "macro pattern" that is used in the present specification and scope of claims is used based on this meaning (definition). The same applies in the ensuing explanation.
2) The high-purity titanium target for sputtering according to 1) above, wherein an average crystal grain size is 10 µm or less.

The present invention additionally provides the following invention.
3) A method of producing a high-purity titanium target for sputtering having a purity of 5N5 (99.9995%) or higher, wherein a melted and cast ingot is subject to primary forging at a temperature of 800 to 950° C., and subject to secondary forging at a temperature exceeding 500° C. but 600° C. or lower.
4) The method of producing a high-purity titanium target for sputtering according to 3) above, wherein cold rolling is performed after the secondary forging, heat treatment is additionally performed at 400 to 460° C., and the ingot is thereafter processed into a target.
5) The method of producing a high-purity titanium target for sputtering according to 3) or 4) above, wherein the produced target has no macro pattern on its surface.
6) The method of producing a high-purity titanium target for sputtering according to any one of 3) to 5) above, of which average crystal grain size is 10 µm or less.

The present invention yields a superior effect of being able to provide a sputtering target, in which impurities causing particles and abnormal discharge phenomena are reduced, which is free from fractures and cracks even during high-power sputtering (high-rate sputtering), capable of stabilizing the sputtering characteristics, and free from macro pattern irregularities, and of which average crystal grain size is 10 microns or less; and to further provide a high-quality titanium target for sputtering, which is capable of improving the uniformity during deposition and effectively inhibiting the generation of particles.

BRIEF DESCRIPTION OF DRAWINGS

FIG. 1 This is a photograph showing the appearance of the target on which a macro pattern is formed.

DETAILED DESCRIPTION

The high-purity titanium target for sputtering of the present invention has a purity of 5N5 (99.9995%) or higher. Conventionally, this kind of high-purity titanium target faced a problem in which a macro pattern is formed on the target surface, but the high-purity titanium target of the present invention having a purity of 5N5 (99.9995%) or higher is completely free from the macro pattern defined above.

The exterior photograph of a target in which a macro pattern is formed thereon is shown in FIG. 1. The photograph on the left side of FIG. 1 shows the A part of the surface where a macro pattern is formed on the target, whereas the upper right diagram of FIG. 1 shows an enlarged photograph (B part) of the A part, and the lower right diagram of FIG. 1 shows an enlarged photograph of the B part. As shown in FIG. 1, a streaky macro pattern is observed on the target surface.

As described above, since a macro pattern causes the non-uniformity of the structure of the target surface, the reduction or inhibition of such macro pattern plays an important role in improving the quality of the target and sputtering deposition.

The crystal orientation of the titanium target was obtained based on the definition of the Basal plane orientation rate shown in Table 1.

TABLE 1

The plane of ±30° relative to the (002) plane is calculated as the Basal plane $$\text{Basal plane orientation rate} \equiv \frac{\frac{I(002)}{I^*(002)} + \frac{I(103)}{I^*(103)} + \frac{I(014)}{I^*(014)} + \frac{I(015)}{I^*(015)}}{\sum \frac{I(hkl)}{I^*(hkl)}} \times 100$$

I(hkl): measured intensity of (hkl)
I*(hkl): relative intensity of JCPDS card

When the foregoing high-purity titanium target for sputtering is used in sputtering, yielded is a superior effect of being able to improve the uniformity during deposition and effectively inhibit the generation of particles.

In addition, by causing the average crystal grain size of the high-purity titanium target for sputtering to be 10 μm or less, it is possible to further increase the effect of improving the uniformity during deposition and inhibiting the generation of particles.

Upon producing the high-purity titanium target of the present invention having a purity of 5N5 (99.9995%) or higher, an melted and cast ingot is subject to primary forging at a temperature of 800 to 950° C. to be compacted until the diameter becomes 40 to 50% of the initial diameter, and secondary forging at a temperature exceeding 500° C. but 600° C. or lower to be further compacted until the diameter becomes 40 to 60% of the diameter after the primary forging, the compact is thereafter cut out slice by slice, and each of them is subject to cold rolling and heat treatment to produce the high-purity titanium target of the present invention. Conventionally, primary forging was performed at a temperature of 800 to 950° C. and secondary forging was performed at a temperature of 600 to 700° C., but under these conditions it was not possible to eliminate the macro pattern on the target surface.

Nevertheless, by performing the secondary forging at a temperature exceeding 500° C. but 600° C. or lower as with the present invention, it became possible to eliminate the formation of a macro pattern. A range that deviates from the foregoing upper limit and lower limit of the temperature causes the formation of a macro pattern defined below, and needs to be avoided.

A macro pattern can be easily distinguished by observing the structure of the target surface. Even if stringency is demanded, a macro pattern can also be easily distinguished by checking the average crystal grain size and the crystal orientation since the average crystal grain size differs by 20% or more and the crystal orientation ratio differs by 10% or more in the locations where a macro pattern is formed.

Moreover, the reduction of a macro pattern hardly affect the productivity associated with the change in production process, and can yield considerable effects.

In addition, after performing the secondary forging, it is even more effective to perform cold rolling and then heat treatment at 400 to 460° C. to process the ingot into a target.

Conventionally, the heat treatment temperature of a titanium rolled plate having a purity of 4N5 or 5N exceeds 460° C. but being 500° C. or lower, but by lowering the heat treatment temperature to 400 to 460° C., it is now possible to obtain fine crystal grains having an average crystal grain size of 10 μm or less. A range deviating from the foregoing temperature conditions is unable to achieve the foregoing results.

Moreover, as described above, since the crystal orientation is stable, it is possible to obtain stable sputtering characteristics, and this is effective for the uniformity of the deposition.

The known molten salt electrolysis method may be used for producing the high-purity titanium. This method is briefly explained below. The atmosphere of the molten salt electrolysis is desirably an inert atmosphere. The electrolysis is desirably performed by setting the initial cathode current density at a low current density of 0.6 A/cm$^2$ or less. In addition, the electrolysis temperature is preferably set to 600 to 800° C.

The thus obtained electrodeposited Ti is additionally subject to EB (electron beam) melting and then subject to cooling solidification to prepare an ingot, and the prepared ingot is subject to hot plastic working such as hot forging or hot extrusion at 800 to 950° C. to prepare a billet.

Based on the foregoing processes, the non-uniform and coarse cast structure of the ingot can be destroyed and made to be uniform and fine. The thus obtained billet is subject to the foregoing secondary forging, rolling and heat treatment, and ultimately processed into a target.

EXAMPLES

Examples of the present invention are now explained. Note that these Examples are merely exemplifications and the present invention shall not be limited thereto. Specifically, the present invention covers all modes or modifications other than the Examples included in the scope of technical concept of the present invention.

Example 1

A titanium ingot obtained by melting and casting titanium having a purity of 5N5 was subject to primary forging at 850° C. and secondary forging at 600° C., subsequently cut and subject to cold rolling, and thereafter subject to heat treatment at 430° C. in a fluidized bed furnace. In addition, the resultant product was machined and diffusion-bonded with a Cu alloy backing plate to prepare a sputtering target having a titanium diameter of approximately φ430 mm.

The thus prepared titanium target was free from the macro pattern irregularity defined in the present invention, and the average crystal grain size was uniform in the plane; specifically, the average crystal grain sizes were respectively 8 μm at the center part, 9 μm at the R/2 part, and 8 μm at the peripheral part. Note that R represents the radius of the disk-shaped target.

Note that the average crystal grain size was measured by observing the area of 190 μm×230 μm of the respective locations, and performing linear analysis. The same applies in the Examples and Comparative Examples.

Moreover, the crystal orientation ratio was uniform in the plane; specifically, the crystal orientation ratios were respectively 74% at the center part, 78% at the R/2 part, and 72% at the peripheral part. Moreover, a TiN film having a thickness of 20 nm was formed on a SiO$_2$ substrate at a power of 38 kW as a sputtering condition.

As a result of the sputter evaluation, the uniformity was 2.3% and the average number of particles was 7 particles, and the results were favorable. Note that the uniformity was measured using Omnimap (RS-100) manufactured by KLA-Tencor, and the number of particles was measured using the particle counter (Surfscan SP1-DLS) manufactured by KLA-Tencor.

Table 2 shows the existence of a macro pattern, average crystal grain size and its maximum difference, crystal orientation ratio and its maximum difference, uniformity, and number of particles of the titanium target of Example 1.

TABLE 2

| | Macro pattern | Average crystal grain size (μm) | | | Max difference (%) of average crystal grain size | Crystal orientation ratio (%) | | | Max difference (%) of crystal orientation ratio | Uniformity (%) | Number of particles |
|---|---|---|---|---|---|---|---|---|---|---|---|
| | | Center | R/2 | Periphery | | Center | R/2 | Periphery | | | |
| Example 1 | No | 8 | 9 | 8 | 12.5 | 74 | 78 | 72 | 8.3 | 2.3 | 7 |
| Example 2 | No | 9 | 9 | 9 | 0 | 74 | 75 | 73 | 2.7 | 2.2 | 9 |
| Comparative Example 1 | Yes | part where macro pattern is observed: 6 μm; part where macro pattern is not observed: 8 μm | | | 25 | part where macro pattern is observed: 72%; part where macro pattern is not observed: 63% | | | 12.5 | 6.3 | 15 |
| Reference Example 2 | No | 12 | 13 | 13 | 8 | 82 | 83 | 80 | 3.75 | 3.4 | 21 |
| Comparative Example 3 | — | — | — | — | — | — | — | — | — | — | — |

Example 2

An ingot obtained by melting and casting titanium having a purity of 5N5 was subject to primary forging at 800° C. and compaction forging at 500° C., subsequently cut and subject to cold rolling, and thereafter subject to heat treatment at 460° C. in a fluidized bed furnace. In addition, the resultant product was machined and diffusion-bonded with a Cu alloy backing plate to prepare a sputtering target having a titanium diameter of approximately φ430 mm. The thus prepared titanium target was free from a macro pattern, and the average crystal grain size was uniform; specifically, the average crystal grain sizes were respectively 9 μm at the center part, 9 μm at the R/2 part, and 9 μm at the peripheral part.

Moreover, the crystal orientation ratios were respectively 74% at the center part, 75% at the R/2 part, and 73% at the peripheral part. Moreover, a TiN film having a thickness of 20 nm was formed on a SiO$_2$ substrate at a power of 38 kW as a sputtering condition.

As a result of the sputter evaluation, the uniformity was 2.2% and the average number of particles was 9 particles. Note that the uniformity was measured using Omnimap (RS-100) manufactured by KLA-Tencor, and the number of particles was measured using the particle counter (Surfscan SP1-DLS) manufactured by KLA-Tencor.

Table 2 shows the existence of a macro pattern, average crystal grain size and its maximum difference, crystal orientation ratio and its maximum difference, uniformity, and number of particles of the titanium target of Example 2.

Comparative Example 1

An ingot obtained by melting and casting titanium having a purity of 5N5 was subject to primary forging at 850° C. and secondary forging at 700° C., subsequently cut and subject to cold rolling, and thereafter subject to heat treatment at 430° C. in a fluidized bed furnace. In addition, the resultant product was machined and diffusion-bonded with a Cu alloy backing plate to prepare a sputtering target having a titanium diameter of approximately φ430 mm. A macro pattern irregularity was observed on the target. Moreover, the average crystal grain sizes of locations where a macro pattern was observed and locations where a macro pattern was not observed were 6 μm and 8 μm respectively, and the difference was 20% or more; whereas the crystal orientation ratios were 72% and 63% respectively, and the difference was 10% or more.

Moreover, a TiN film having a thickness of 20 μm was formed on a SiO$_2$ substrate at a power of 38 kW as a sputtering condition. As a result of the sputter evaluation, the uniformity was 6.3% and the average number of particles was 15 particles, and the results were inferior. Note that the uniformity was measured using Omnimap (RS-100) manufactured by KLA-Tencor, and the number of particles was measured using the particle counter (Surfscan SP1-DLS) manufactured by KLA-Tencor.

Table 2 shows the existence of a macro pattern, average crystal grain size and its maximum difference, crystal orientation ratio and its maximum difference, uniformity, and number of particles of the titanium target of Comparative Example 1.

Reference Example 2

An ingot obtained by melting and casting titanium having a purity of 5N5 was subject to primary forging at 800° C. and compaction forging at 500° C., subsequently cut and subject to cold rolling, and thereafter subject to heat treatment at 470° C. in a fluidized bed furnace. In addition, the resultant product was machined and diffusion-bonded with a Cu alloy backing plate to prepare a sputtering target having a titanium diameter of approximately φ430 mm.

The thus prepared titanium target was free from a macro pattern, but the average crystal grain size was larger than 10 μm; specifically, the average crystal grain sizes were respectively 12 μm at the center part, 13 μm at the R/2 part, and 13 μm at the peripheral part. Moreover, the crystal orientation ratios were respectively 82% at the center part, 83% at the R/2 part, and 80% at the peripheral part. Moreover, a TiN film having a thickness of 20 nm was formed on a SiO$_2$ substrate at a power of 38 kW as a sputtering condition. As a result of the sputter evaluation, the uniformity was 3.4% and the average number of particles was 21 particles, and the results were inferior.

Note that the uniformity was measured using Omnimap (RS-100) manufactured by KLA-Tencor, and the number of particles was measured using the particle counter (Surfscan SP1-DLS) manufactured by KLA-Tencor.

A macro pattern was not observed, the difference in the average crystal grain size and the difference in the crystal orientation ratio fell within the scope of the present invention, and the uniformity was favorable in comparison to Comparative Example 1. Nevertheless, since the number of particles tends to increase when the average crystal grain size increases, this example is indicated as a Reference Example. This example yields a corresponding effect in the sense that a macro pattern is not formed. Based on the above, it could be said that the adjustment of the average crystal grain size as needed is a more desirable condition.

Table 2 shows the existence of a macro pattern, average crystal grain size and its maximum difference, crystal orientation ratio and its maximum difference, uniformity, and number of particles of the titanium target of Reference Example 2.

Comparative Example 3

An ingot obtained by melting and casting titanium having a purity of 4N5 was subject to primary forging at 850° C. and compaction forging at 400° C. The ingot was subsequently cut and subject to cold rolling, but the accumulation of strain became excessive and cracks were generated during the rolling process.

Since the present invention can provide a high-quality titanium target for sputtering, in which impurities causing particles and abnormal discharge phenomena are reduced, and which is free from fractures and cracks even during high-power sputtering (high-rate sputtering), and capable of stabilizing the sputtering characteristics and effectively inhibiting the generation of particles during deposition, the present invention is useful in forming a thin film of electronic devices and the like.

The invention claimed is:

1. A high-purity titanium target for sputtering having a purity of 5N5 (99.9995%) or higher, wherein the high-purity titanium target has no macro pattern in which a difference in average crystal grain size is 20% or more and a difference in crystal orientation ratio is 10% or more on the target surface.

2. The high-purity titanium target for sputtering according to claim 1, wherein an average crystal grain size is 10 µm or less.

3. A method of producing a high-purity titanium target for sputtering having a purity of 5N5 (99.9995%) or higher, wherein a melted and cast ingot is subject to primary forging at a temperature of 800 to 950° C., and subject to secondary forging at a temperature exceeding 500° C. but 600° C. or lower to produce the target having no macro pattern on its surface.

4. The method of producing a high-purity titanium target for sputtering according to claim 3, wherein cold rolling is performed after the secondary forging, heat treatment is additionally performed at 400 to 460° C., and the ingot is thereafter processed into a target.

5. The method of producing a high-purity titanium target for sputtering according to claim 4, of which average crystal grain size is 10 µm or less.

6. The method of producing a high-purity titanium target for sputtering according to claim 3, wherein an average crystal grain size of the target is 10 µm or less.

7. The method of producing a high-purity titanium target for sputtering according to claim 6, wherein an average crystal grain size at a center part of the target surface, an average crystal grain size of a peripheral part of the target surface, and an average crystal grain size of a part halfway between the center part and the peripheral part of the target surface differ by no more than 20%.

8. The high-purity titanium target for sputtering according to claim 2, wherein an average crystal grain size at a center part of the target surface, an average crystal grain size of a peripheral part of the target surface, and an average crystal grain size of a part halfway between the center part and the peripheral part of the target surface differ by no more than 20%.

9. The method of producing a high-purity titanium target for sputtering according to claim 6, wherein the high-purity titanium target has no macro pattern on the target surface such that no part of the target surface has a difference in average crystal grain size of 20% or more and a difference in crystal orientation ratio of 10% or more relative to other parts of the target surface.

10. A method of producing a high-purity titanium target for sputtering, comprising the steps of:
melting and casting titanium having a purity of 5N5 (99.9995%) or higher to produce an ingot;
forging the ingot during a primary forging step at a temperature of 800 to 950° C.;
after said primary forging step, forging the ingot during a secondary forging step at a temperature exceeding 500° C. but 600° C. or lower;
after said secondary forging step, cold rolling the ingot;
after said cold rolling, subjecting the ingot to heat treatment at a temperature of 400 to 460° C.; and
after said heat treatment, processing the ingot into a titanium sputtering target such that the titanium sputtering target has a purity of 5N5 (99.9995h%) or higher, an average crystal grain size of 10 µm or less, and no macro pattern on a surface thereof in which a difference in average crystal grain size is 20% or more and a difference in crystal orientation ratio is 10% or more on the surface.

* * * * *